United States Patent
Chan et al.

(10) Patent No.: US 8,325,549 B2
(45) Date of Patent: *Dec. 4, 2012

(54) GLOBAL BIT SELECT CIRCUIT INTERFACE WITH SIMPLIFIED WRITE BIT LINE PRECHARGING

(75) Inventors: Yuen Hung Chan, Poughkeepsie, NY (US); Antonia R. Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 323 days.

This patent is subject to a terminal disclaimer.

(21) Appl. No.: 12/713,670

(22) Filed: Feb. 26, 2010

(65) Prior Publication Data

US 2011/0211401 A1 Sep. 1, 2011

(51) Int. Cl.
*G11C 7/00* (2006.01)
(52) U.S. Cl. ....................................................... 365/203
(58) Field of Classification Search .................. 365/203
See application file for complete search history.

(56) References Cited

U.S. PATENT DOCUMENTS

| | | |
|---|---|---|
| 5,630,091 A | 5/1997 | Lin et al. |
| 5,729,501 A | 3/1998 | Phillips et al. |
| 5,806,084 A | 9/1998 | Lin et al. |
| 6,002,633 A | 12/1999 | Oppold et al. |
| 6,047,359 A | 4/2000 | Fouts |
| 6,058,065 A | 5/2000 | Lattimore et al. |
| 6,091,629 A | 7/2000 | Osada et al. |
| 6,529,519 B1 | 3/2003 | Steiner et al. |
| 6,633,501 B2 | 10/2003 | Wedel |
| 6,657,886 B1 | 12/2003 | Adams et al. |
| 6,876,595 B2 | 4/2005 | Bhavnagarwala et al. |
| 7,065,613 B1 | 6/2006 | Flake et al. |
| 7,102,946 B2 | 9/2006 | Pelella |
| 7,113,433 B2 | 9/2006 | Chan et al. |

(Continued)

FOREIGN PATENT DOCUMENTS

WO 2008150927 A2 12/2008

OTHER PUBLICATIONS

A. R. Pelella et al.; "A 8Kb Domino Read SRAM with Hit Logic and Parity Checker;" ESSCIRC, Grenoble, France 2005; pp. 359-362.

*Primary Examiner* — Hoai V Ho
*Assistant Examiner* — Min Huang
(74) *Attorney, Agent, or Firm* — Cantor Colburn LLP; William A. Kinnaman, Jr.

(57) ABSTRACT

A global to local bit line interface circuit for domino SRAM devices includes a pair of complementary global write bit lines in selective communication with an array of SRAM cells through local write bit lines, the global write bit lines configured to write a selected SRAM cell with data presented on a pair of write data input lines; a pair of complementary global read bit lines in selective communication with the array through local read bit lines, the global read bit lines configured to read data stored in a selected cell and present the read data on a pair of read data output lines; and write control logic configured to control precharging of the global write bit lines independently with respect to the global read bit lines, and wherein a pulse width of write data on the global write bit lines is determined only by a global column select signal.

12 Claims, 6 Drawing Sheets

U.S. PATENT DOCUMENTS

| | | |
|---|---|---|
| 7,170,774 B2 | 1/2007 | Chan et al. |
| 7,272,030 B2 | 9/2007 | Chan et al. |
| 7,293,209 B2 | 11/2007 | Chan et al. |
| 7,305,602 B2 | 12/2007 | Chan et al. |
| 7,336,546 B2 | 2/2008 | Chan et al. |
| 7,356,656 B1 | 4/2008 | Chang |
| 7,420,858 B2 * | 9/2008 | Joshi .............................. 365/195 |
| 7,463,537 B2 | 12/2008 | Chan et al. |
| 7,478,297 B2 | 1/2009 | Chan et al. |
| 7,535,776 B1 | 5/2009 | Behrends et al. |
| 7,596,050 B2 | 9/2009 | Scheuerlein et al. |
| 7,975,109 B2 | 7/2011 | McWilliams et al. |
| 2004/0083329 A1 * | 4/2004 | Osada et al. ..................... 711/1 |
| 2006/0268656 A1 | 11/2006 | Yokoyama |
| 2007/0127305 A1 * | 6/2007 | Imai et al. ................ 365/230.04 |
| 2008/0056052 A1 * | 3/2008 | Chan et al. ............... 365/230.03 |
| 2008/0247246 A1 | 10/2008 | Joshi |
| 2008/0298137 A1 | 12/2008 | Chan et al. |
| 2008/0301256 A1 | 12/2008 | McWilliams et al. |
| 2008/0310246 A1 | 12/2008 | Joshi et al. |
| 2009/0154213 A1 * | 6/2009 | Kim et al. ....................... 365/51 |
| 2009/0285009 A1 * | 11/2009 | Kim et al. ..................... 365/148 |
| 2010/0214857 A1 * | 8/2010 | Hsu et al. ....................... 365/191 |
| 2010/0220531 A1 | 9/2010 | Shinagawa et al. |
| 2011/0211400 A1 | 9/2011 | Chan et al. |

* cited by examiner

GLOBAL BIT SELECT CIRCUIT INTERFACE WITH SIMPLIFIED WRITE BIT LINE PRECHARGING

BACKGROUND

The present invention relates generally to integrated circuit memory devices and, more particularly, to a high performance, domino Static Random Access Memory (SRAM) in which the core cells of the memory are segmented into sub-arrays accessed by local bit lines connected to global bit lines, with an interface between dual read and write global bit line pairs and local bit line pairs.

As will be appreciated by those skilled in the art, in a domino SRAM, the individual cells do not employ sense amplifiers to sense the differential voltage on the bit line pairs coupled to the cross-coupled inverters that store the data. Rather, for a domino SRAM, the local bit line is precharged, discharged, and the discharge is detected. The local bit line, the means to precharge the local bit line, and the detector define a dynamic node of the domino SRAM. More detailed information regarding the construction and operation of domino SRAMs may be found in U.S. Pat. Nos. 5,729,501 and 6,657,886, both assigned to the assignee of this application, and incorporated herein by reference.

In addition, U.S. Pat. No. 6,058,065, also assigned to the assignee of this application and incorporated herein by reference, discloses a memory array in which the core cells are organized in subarrays accessed by local bit lines connected to global bit lines. U.S. Pat. No. 7,113,433, also assigned to the assignee of this application and incorporated herein by reference, discloses a domino SRAM with one pair of global bit lines for a read operation and another pair of global bit lines for a write operation. An advantage of having two global bit line pairs is better overall performance in terms of faster reading from and writing to the memory cells. However, it is important that the interface from the global bit lines to the local bit line pairs does not detract from these performance gains.

SUMMARY

In an exemplary embodiment, a global to local bit line interface circuit for domino static random access memory (SRAM) devices includes a pair of complementary global write bit lines in selective communication with an array of SRAM cells through corresponding local write bit lines, the complementary global write bit lines configured to write a selected SRAM cell with data presented on a pair of complementary write data input lines; a pair of complementary global read bit lines in selective communication with the array of SRAM cells through corresponding local read bit lines, the complementary global read bit lines configured to read data stored in a selected SRAM cell and present the read data on a pair of complementary read data output lines; and write control logic configured to control precharging of the complementary global write bit lines independently with respect to precharging of the complementary global read bit lines, and wherein a pulse width of write data on the complementary global write bit lines is determined only by a global column select signal.

In another embodiment, a method of implementing reading and writing data in domino static random access memory (SRAM) devices includes selectively coupling a pair of complementary global write bit lines in with an array of SRAM cells through corresponding local write bit lines, the complementary global write bit lines configured to write a selected SRAM cell with data presented on a pair of complementary write data input lines; selectively coupling a pair of complementary global read bit lines with the array of SRAM cells through corresponding local read bit lines, the complementary global read bit lines configured to read data stored in a selected SRAM cell and present the read data on a pair of complementary read data output lines; and configuring write control logic to control precharging of the complementary global write bit lines independently with respect to precharging of the complementary global read bit lines, and wherein a pulse width of write data on the complementary global write bit lines is determined only by a global column select signal.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a global bit select circuit for domino read SRAM devices that interfaces with a local bit select circuit (or group of local bit select circuits), and that uses a dual bit line approach. That is, one bit line pair is used for read operations and another bit line pair is used for write operations. More specifically, the global bit select circuit embodiments presented herein simplify the precharging scheme for the global write bit line pair by rendering write bit line precharging independent from a global reset signal otherwise used for precharging the global read bit line pair and instead limiting the precharging timing control to the state of the global column select (i.e., "bit decode") signal through write control logic. In so doing, the number of variables affecting the write window to the memory cells is reduced.

Figure 1:
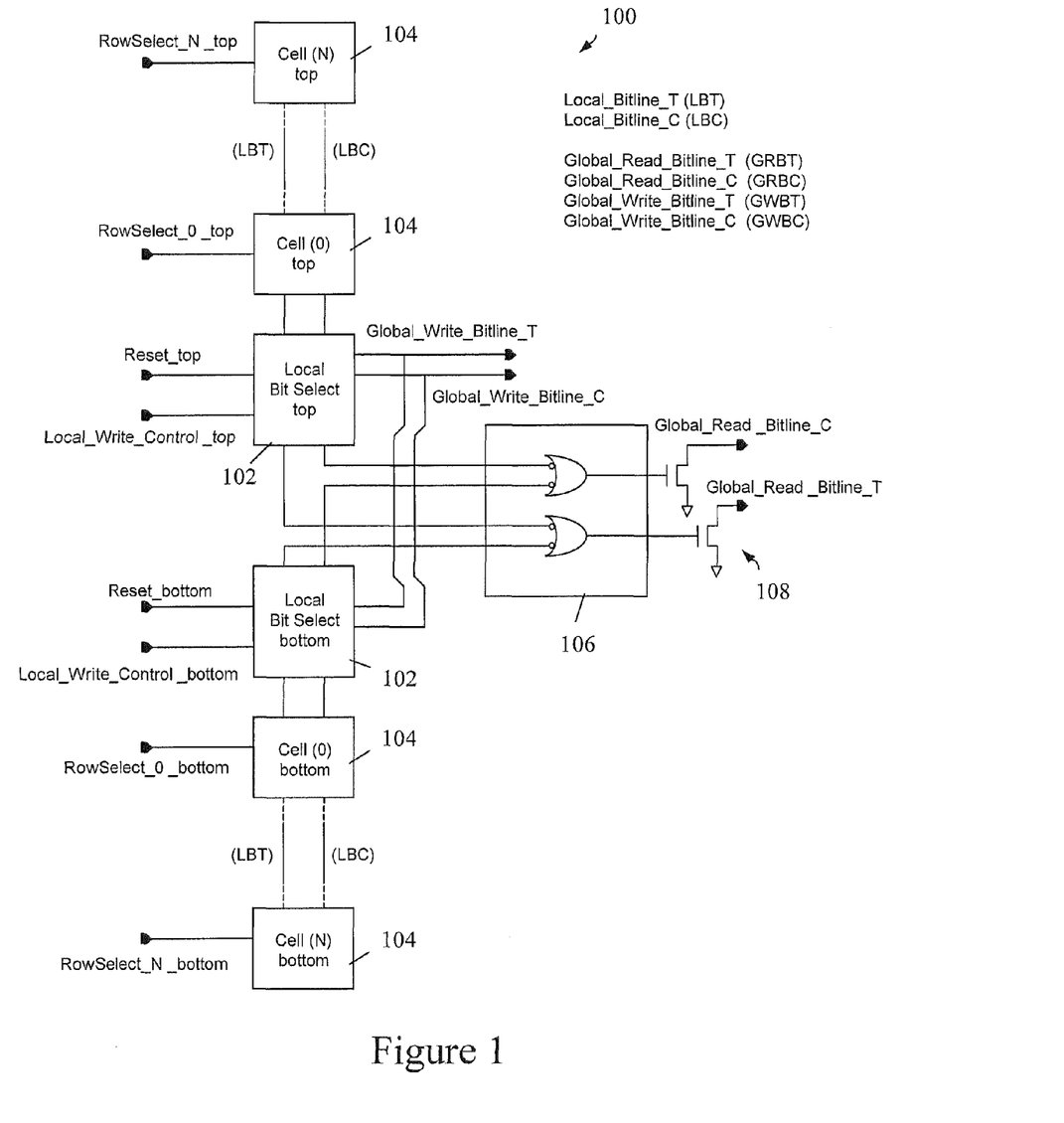
FIG. 1 is a schematic block diagram of an N-cell subarray of a domino SRAM suitable for use in accordance with an embodiment of the invention.

Referring initially to FIG. 1, there is shown a schematic block diagram of an N-cell subarray 100 of a domino SRAM suitable for use in accordance with an embodiment of the invention. The domino SRAM subarray 100 is accessed by local bit select logic 102 (top and bottom), and has 0 through N cells 102 labeled "top," as well as 0 through N cells labeled "bottom." The top and bottom cells 104 are mirrored around an active low input OR logic block 106, with half the cells on one side and half on the other. The local bit lines (labeled LBT and LBC in FIG. 1) are ORed together (i.e., the top local bit line complement (LBC) is ORed with the bottom LBC, and the top local bit line true (LBT) is ORed with the bottom LBT) to drive the wired OR NFETs (generally indicated at 108), the outputs of which are respectively connected to the complement and true global read bit lines GRBC, GRBT. In the preceding sentence and elsewhere herein, "NFET" signifies an n-channel field effect transistor (FET), while "PFET" signifies a p-channel FET.

In a standby state, the local bit lines are precharged to a logic high level. Then, for a read mode, the active memory cell (from either the top or bottom sub array) pulls down on one of the local bit lines, depending on the value of the data stored on the cell. The active low bit line, through the corresponding OR gate of block 106, turns on one of the wired OR NFETs 108 to pull down the corresponding global read bit line (GRBC or GRBT). By arranging the cells around a central point of the OR logic 106, the RC delay on the local bit lines is reduced since the distance to the furthest cell has been reduced by half. This improves the write performance as well as the read access time of the subarray.

The local bit select circuits 102, in addition to providing the read signal transfer, also provide the write control function. As further shown in FIG. 1, the top and bottom local bit select circuits 102 each have a pair of global write bit lines (GWBT and GWBC) as inputs thereto. The write operation is controlled by the local write control line (top/bottom). Further, each local bit select circuit 102 also performs, through the reset (top/bottom) signal, the bit line precharge function (also known as a bit line restore) at the end of an active read or write cycle.

Figure 2:
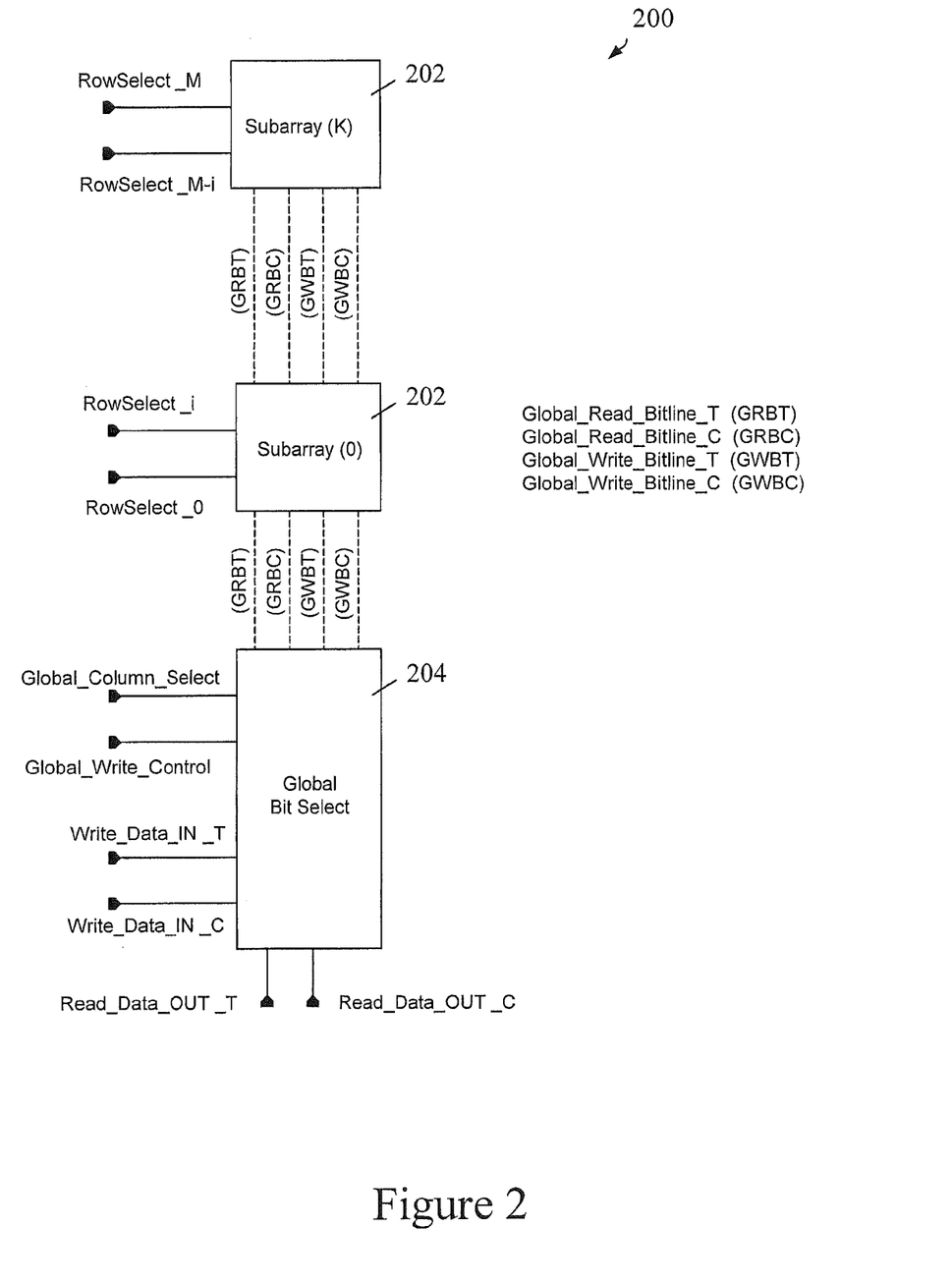
FIG. 2 is a schematic block diagram of a one-bit by M bit array of a domino SRAM where K subarrays (each containing i cells along the local bit lines) are connected to one global bit select circuit.

FIG. 2 is a schematic block diagram of a one-bit by M bit array 200 of a domino SRAM where K subarrays 202 (each containing i cells along the local bit lines) are connected to one global bit select circuit 204.

Figure 3:
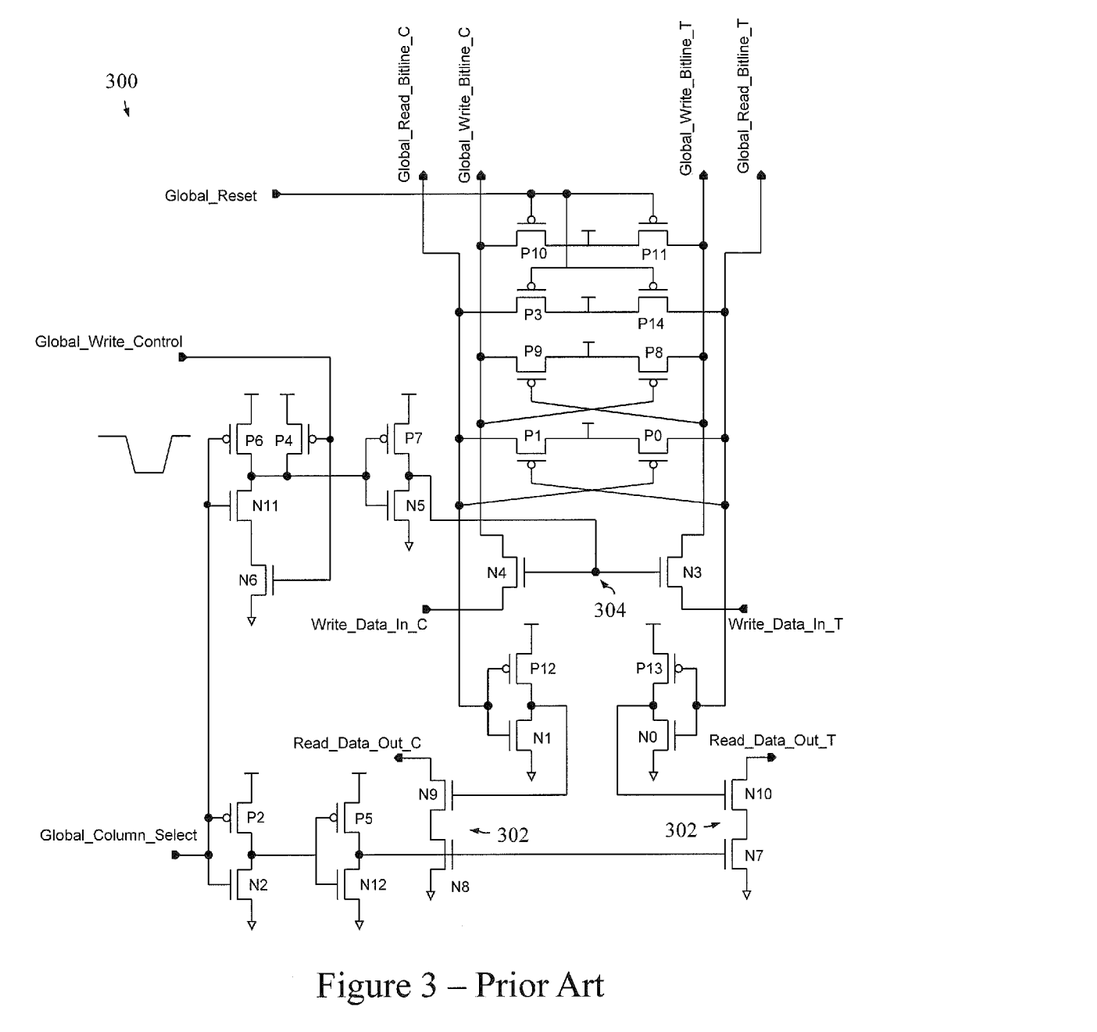
FIG. 3 is a schematic diagram of a domino SRAM global to local bit select circuit.

Referring now to FIG. 3, there is shown a schematic diagram of one implementation of a domino SRAM global to local bit select circuit 300, such as that described in the aforementioned U.S. Pat. No. 7,113,433. As is shown, the circuit 300 includes a global read bit line pair (Global_Read_Bitline_C/Global_Read_Bitline_T) as inputs thereto, and a global write bit line pair (Global_Write_Bitline_C/Global_Write_Bitline_T) as outputs therefrom. Both of the two global bit line pairs are connected to the local bit select circuits (not shown in FIG. 3) along the bit column. In addition, the circuit 300 also has a data bus, including a pair of write data inputs (Write_Data_In_C/Write_Data_In_T) and a pair of read data outputs (Read_Data_Out_C/Read_Data_Out_T). Column select signals for the circuit 300 include a Global_Column_Select signal and a Global_Write_Control signal. The Global_Column_Select signal, as the name suggests, selects the bit column for a read or a write operation. The Global_Write_Control enables the column for a write operation. Restore (precharge) of both the global read and write bit line pairs is provided by the Global_Reset signal, which is an active low signal.

In operation, when the Global_Reset signal is active low (as opposed to high during standby and read/write operations), PFET transistors P10/P11 restore the global write bit lines, while PFET transistors P3/P14 restore the global read bit lines. In addition, two pairs of cross-coupled "keep-quiet" PFET transistors (P0/P1 and P8/P9) are connected to the global read and write bit lines, respectively. When one side of the bit lines is pulled low during a read or a write operation, the corresponding PFET is turned on so to hold the opposite side of the bit line high (that is, keeping it in a quiet up level). In so doing, these cross-coupled "keep-quiet" PFETs maintain glitch-free (noise-free) read and write operations.

The Global_Column_Select input (coming from the bit decode circuitry, not shown in FIG. 3) selects the bit column for both the read and write operation, and is an active high signal. The Global_Write_Control input (also an active high signal) controls the write data bus during a write operation. In a standby mode, both the Global_Column_Select and the Global_Write_Control signals are off, while the Global_Reset signal is on (low active) to precharge both the global read and write bit lines high. Also, in the standby mode, the cross-coupled "keep-quiet" PFETs are off. The read data output bus (Read_Data_Out_C/Read_Data_Out_T) is also precharged high by data output reset circuitry (not shown in FIG. 3).

In a read mode of operation, the Global_Reset signal is first switched high, turning off the pre-charge PFETs. The Global_Column_Select input is then activated while the Global_Write_Control input is kept low (low for reading and high for writing). In so doing, the bottom NFETs (N8, N7) of the NFET stacks 302 coupled to the true and complement read data output bus become activated via the inverter pair P2/N2 and P5/N12, and will allow discharge of either Read_Data_Out_C or Read_Data_Out_T, depending on the state of the cell data. Concurrently, the common gate node 304 coupled to N3 and N4 of the circuit is kept low by the inactive Global_Write_Control signal to disable write NFETs N3/N4.

Thus, for the specific case where a "1" is read from the memory cell, Global_Read_Bitline_T will remain high, whereas Global_Read_Bitline_C will discharge. This in turn causes the output of inverter P12/N1 to go high and activate NFET N9, thereby discharging Read_Data_Out_C. Conversely, because Global_Read_Bitline_T remains high when reading a "1", the output of inverter P13/N0 remains low, keeping NFET N10 inactive and preventing the precharged Global_Read_Bitline_T from discharging. As a result, the correct complementary data is output from Global_Read_Bitline_T and Global_Read_Bitline C.

In a write mode of operation, the Global_Reset signal is first deactivated by going high (as in the read mode), while the write data inputs (Write_Data_In_C/Write_Data_In_T) are presented with write data thereon. That is, one of the precharged Write_Data_In_C/Write_Data_In_T lines is pulled low while the other remains in the precharged high state. Then, both the Global_Column_Select and the Global_Write_Control inputs are both activated. Thus, in addition to driving node 304 high and activating the writing NFETs N3/N4, the bottom NFETs (N8, N7) of the NFET stacks 302 coupled to the true and complement read data output bus also become activated in the write mode.

For a specific case where a "0" is to be written to the memory cell, for example, the Write_Data_In_T signal is held low, pulling down Global_Write_Bitline_T through N3. Because Write_Data_In_C is held high, Global_Write_Bitline_C will not discharge through N4 and instead remain high. This state of the global write bit lines is passed to the local bit select circuit (not shown in FIG. 3), which in turn writes a "0" into the selected memory cell.

Figure 4:
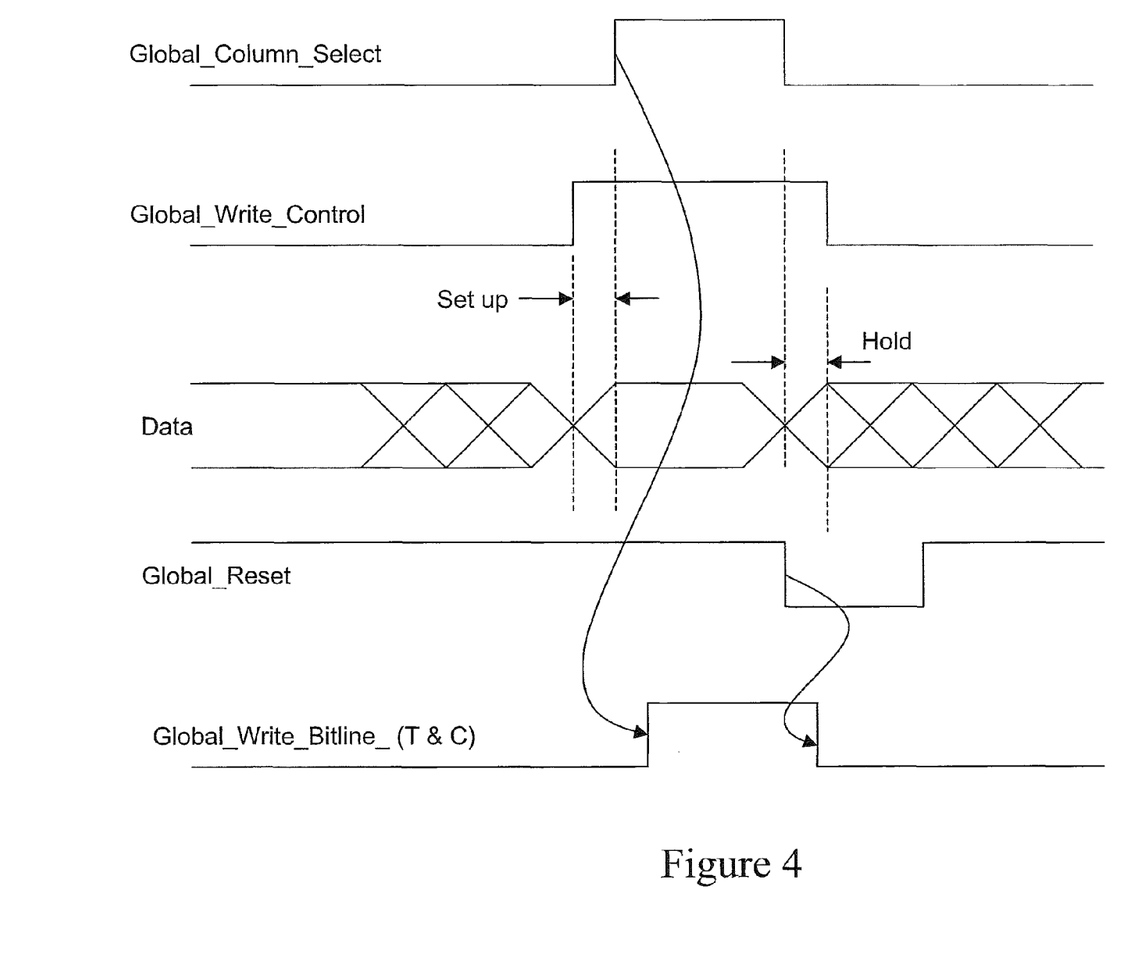
FIG. 4 is a timing diagram illustrating the write operation of the domino SRAM global to local bit select circuit of FIG. 3.

FIG. 4 is a timing diagram illustrating the write operation of the domino SRAM global to local bit select circuit 300 of FIG. 3 in further detail. As is shown, the active Global_Write_Control signal overlaps the active Global_Column_Select signal. Assuming the Global_Reset signal remains deactivated (high), the differential data present on the Write_Data_In_T and Write_Data_In_C data input lines will be coupled to the global write bit line pair, so long as both Global_Write_Control and Global_Column_Select signal are high. Ideally, then, the pulse width of the differential data on Global_Read_Bitline_T and Global_Read_Bitline_C (the bottom waveform in FIG. 4) is determined by the falling edge of the Global_Column_Select signal. However, based on the logical configuration of the circuitry in FIG. 3, other variables besides the Global_Column_Select signal can affect the write window to the memory cells.

For example, as also shown in FIG. 4, the Global_Reset signal must not be activated (falling low) until the falling edge of the Global_Column_Select signal. Otherwise, a premature reset signal (low pulse) will destroy the differential data on Global_Read_Bitline_T and Global_Read_Bitline_C due to the resulting precharging thereof, even though both the Global_Write_Control and Global_Column_Select signal may still be active high.

Figure 5:
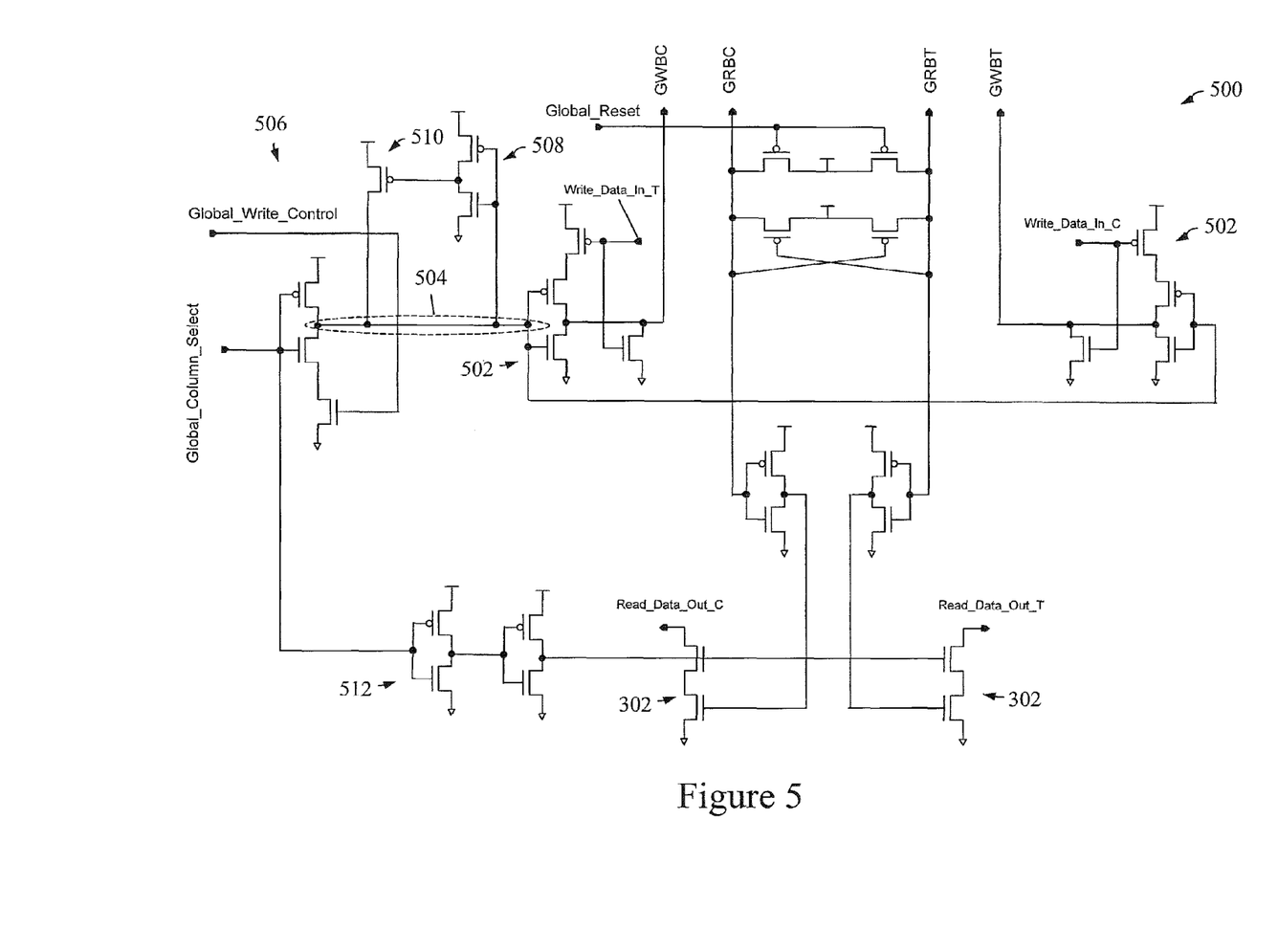
FIG. 5 is a schematic diagram of a domino SRAM global to local bit select circuit configured for false write-through data blocking, in accordance with an embodiment of the invention.

Accordingly, FIG. 5 is a schematic diagram of a domino SRAM global to local bit select circuit 500 configured for write bit line precharging, independent from a global reset signal. At a high level, the circuit 500 utilizes write control logic to control coupling of the differential input write data to the global write bit line pair, by using only the Global_Column_Select signal as the controlling input, independent of the Global_Reset signal (now used only for precharging the global read bit line pair), as well as the Global_Write_Control signal (due to the dynamic logic explained below).

For purposes of clarity, similar components of the global to local bit select circuit 500 with respect to that of FIG. 3 are designated with the same reference numbers and characters in FIG. 5 where applicable. In addition, the description of similar circuit devices, such as the precharging PFETs and "keep-quiet" PFETs for the global read control circuitry is also omitted. As will first be noted from FIG. 5, in lieu of NFET pass gates controlled by the Global_Reset signal, the circuit 500 incorporates write control logic that includes parallel NOR gates 502, the outputs of which are coupled to GWBC and GWBT. The first of the inputs of the NOR gates 502 corresponds to the input write data presented on Write_Data_In_T and Write_Data_In_C. Here, it will be noted that the true input write data is coupled to the NOR gate 502 associated with the complementary global bit line, and vice versa. The second input to each NOR gate 502 is an output node 504 of a dynamic NAND gate 506, the inputs of which are the Global_Write_Control signal and the Global_Column_Select signal.

In a standby state, both the Global_Column_Select and Global_Write_Control signals are deactivated, which initially charges node 504 high. In order to maintain stability of the node 504, the dynamic NAND gate 506 includes a feedback mechanism having an inverter 508 that initially causes a keeper PFET (or half latch) 510 to maintain the node 504 at logic high potential. When node 504 is high, the outputs of both NOR gates 502 are pulled low, thus keeping GWBC and GWBT in the precharged low state.

In a read mode of operation, the Global_Column_Select signal goes high while the Global_Write_Control stays off. However, the presence of the inverter 508 and keeper PFET 510 keeps node 504 at high. Consequently, since node 504 is still high in the read mode, the outputs of NOR gates 502 remain low, in turn maintaining GWBC and GWBT in the precharged low state. On the other hand, the active high Global_Column_Select signal, through inverter pair 512 renders the NFET stacks 302 ready to read out the cell data on GRBC and GRBT.

In the write mode of operation, both the Global_Write_Control signal and the Global_Column_Select signal are active high. As node 504 begins to be pulled to ground, the inverter 508 in the dynamic NAND gate 506 begins to deactivate keeper PFET 510 until it no longer opposes the discharge of node 504. Once node 504 is discharged, the differential input write data will be coupled to GWBC and GWBT by NOR gates 502.

Figure 6:
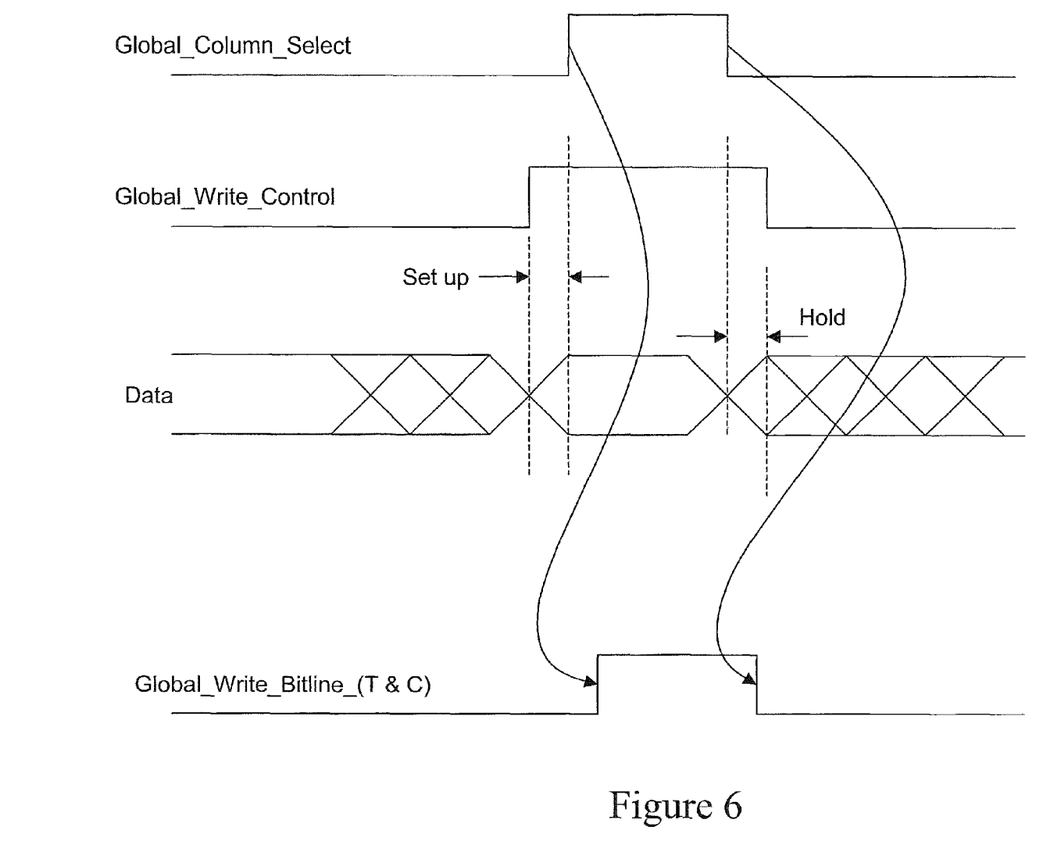
FIG. 6 is a timing diagram illustrating the write operation of the domino SRAM global to local bit select circuit of FIG. 5.

FIG. 6 is a timing diagram illustrating the write operation of the domino SRAM global to local bit select circuit 500 of FIG. 5. As will first be noted, the waveform for the Global_Reset signal is eliminated from FIG. 6, as it now has no effect on the global write bit line pair GWBC and GWBT (and hence does not determine) the global write bit line pulse width. That is, an early active reset signal will not destroy the data on the global write bit line pair as could happen for the circuit 300 of FIG. 3. Secondly, once the write mode is initiated by both the Global_Write_Control signal and the Global_Column_Select signal going high, it is only the falling edge of the Global_Column_Select signal that determines the "write window" (i.e., the global write bit line pulse width). Should the Global_Write_Control signal drop out early, the half latch 510 is still off, and capacitance of node 504 (which is technically floating under such a condition) resists any instantaneous charging thereof from ground. In the alternative, the dynamic NAND gate 506 of circuit 500 could also include a full keeper latch. That is, in addition to keeper PFET 510, the inverter 508 could also control a keeper NFET (not shown) coupled between node 504 and ground. A tradeoff in that case would be overcoming the pull of the keeper NFET when dropping out of the write mode, where node 504 is pulled high to precharge GWBC and GWBT low.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A global to local bit line interface circuit for domino static random access memory (SRAM) devices, the circuit comprising:

a pair of complementary global write bit lines in selective communication with an array of SRAM cells through corresponding local write bit lines, the complementary global write bit lines configured to write a selected SRAM cell with data presented on a pair of complementary write data input lines;

a pair of complementary global read bit lines in selective communication with the array of SRAM cells through corresponding local read bit lines, the complementary global read bit lines configured to read data stored in a selected SRAM cell and present the read data on a pair of complementary read data output lines; and write control logic configured to control precharging of the complementary global write bit lines independently with respect to precharging of the complementary global read bit lines, wherein the write control logic comprises a pair of parallel NOR gates configured to precharge the complementary global write bit lines in a standby mode of operation and in a read mode of operation, and wherein a pulse width of write data on the complementary global write bit lines is determined only by a global column select signal.

2. The circuit of claim 1, wherein the NOR gates are configured to couple the data presented on the pair of complementary write data input lines to the complementary global write bit lines during a write mode of operation.

3. The circuit of claim 2, wherein a first input of the NOR gates is driven by dynamic NAND logic coupled to the global column select signal and a global write control signal, and a second input of the NOR gates is coupled to one of the complementary write data input lines.

4. The circuit of claim 3, wherein the complementary global read bit lines are precharged at a logic high level, and the complementary global write bit lines are precharged at a logic low level.

5. The circuit of claim 4, further comprising a feedback inverter and a keeper half latch coupled to the first input of the NOR gates for assisting the NOR gates in maintaining the complementary global read bit lines in a precharge state until both the global column select signal and the global write control signal are active.

6. The circuit of claim 5, wherein the write logic is configured to prevent any premature deactivation of the global write control signal from instantaneously switching the first input of the NOR gates to the logic high level and terminating the pulse of write data to the precharge state.

7. A method of implementing reading and writing data in domino static random access memory (SRAM) devices, the method comprising:

selectively coupling a pair of complementary global write bit lines in with an array of SRAM cells through corresponding local write bit lines, the complementary global write bit lines configured to write a selected SRAM cell with data presented on a pair of complementary write data input lines;

selectively coupling a pair of complementary global read bit lines with the array of SRAM cells through corresponding local read bit lines, the complementary global read bit lines configured to read data stored in a selected SRAM cell and present the read data on a pair of complementary read data output lines; and configuring write control logic to control precharging of the complementary global write bit lines independently with respect to precharging of the complementary global read bit lines, wherein the write control logic comprises a pair of parallel NOR gates configured to precharge the complementary global write bit lines in a standby mode of operation and in a read mode of operation, and wherein a pulse width of write data on the complementary global write bit lines is determined only by a global column select signal.

8. The method of claim 7, wherein the NOR gates are configured to couple the data presented on the pair of complementary write data input lines to the complementary global write bit lines during a write mode of operation.

9. The method of claim 8, wherein a first input of the NOR gates is driven by dynamic NAND logic coupled to the global column select signal and a global write control signal, and a second input of the NOR gates is coupled to one of the complementary write data input lines.

10. The method of claim 9, wherein the complementary global read bit lines are precharged at a logic high level, and the complementary global write bit lines are precharged at a logic low level.

11. The method of claim 10, further comprising configuring a feedback inverter and a keeper half latch coupled to the first input of the NOR gates for assisting the NOR gates in maintaining the complementary global read bit lines in a precharge state until both the global column select signal and the global write control signal are active.

12. The method of claim 11, wherein the write logic is configured to prevent any premature deactivation of the global write control signal from instantaneously switching the first input of the NOR gates to the logic high level and terminating the pulse of write data to the precharge state.

* * * * *